US012783119B2

(12) United States Patent
Joshua et al.

(10) Patent No.: US 12,783,119 B2
(45) Date of Patent: Nov. 3, 2026

(54) MULTI-PLANE NONVOLATILE MEMORY WITH SERIAL ENCODER AND DECODER CIRCUITS

(71) Applicant: Sandisk Technologies, Inc., Milpitas, CA (US)

(72) Inventors: Alvin Joshua, Fujisawa (JP); Yasuyuki Fujihara, Fujisawa (JP); Hardwell Chibvongodze, Hiratsuka (JP)

(73) Assignee: Sandisk Technologies, Inc., Milpitas, CA (US)

( * ) Notice: Subject to any disclaimer, the term of this patent is extended or adjusted under 35 U.S.C. 154(b) by 100 days.

(21) Appl. No.: 18/825,452

(22) Filed: Sep. 5, 2024

(65) Prior Publication Data

US 2026/0064269 A1 Mar. 5, 2026

(51) Int. Cl.

| | |
|---|---|
| ***G11C 16/04*** | (2006.01) |
| ***G06F 3/06*** | (2006.01) |
| ***G11C 16/08*** | (2006.01) |
| ***H03M 9/00*** | (2006.01) |

(52) U.S. Cl.

CPC .......... *G06F 3/0608* (2013.01); *G06F 3/0655* (2013.01); *G06F 3/0679* (2013.01); *G11C 16/0483* (2013.01); *G11C 16/08* (2013.01); *H03M 9/00* (2013.01)

(58) Field of Classification Search

CPC .... G06F 3/0608; G06F 3/0655; G06F 3/0679; G11C 16/0483; G11C 16/08; H03M 9/00

USPC ...................................... 365/189.011, 230.01

See application file for complete search history.

(56) References Cited

U.S. PATENT DOCUMENTS

| | | | | |
|---|---|---|---|---|
| 5,428,748 | A * | 6/1995 | Davidson | G06F 15/177 711/E12.089 |
| 5,515,430 | A * | 5/1996 | Ozawa | H04Q 11/04 379/88.16 |
| 7,313,030 | B2 * | 12/2007 | Lohse | G11C 16/105 365/185.11 |
| 7,724,598 | B1 * | 5/2010 | Chan | G06F 12/0623 326/38 |
| 7,827,433 | B1 | 11/2010 | Hutton | |
| 7,937,535 | B2 * | 5/2011 | Ozer | G06F 12/0822 711/146 |
| 9,697,914 | B2 * | 7/2017 | Sato | G21C 15/18 |
| 9,935,870 | B2 | 4/2018 | Fraisse | |
| 10,007,439 | B2 | 6/2018 | Kim | |
| 10,141,936 | B2 | 11/2018 | Lewis et al. | |
| 11,115,004 | B1 * | 9/2021 | Stanley | H03H 17/0018 |
| 2001/0024397 | A1 * | 9/2001 | Kubota | G11C 7/1006 365/219 |

(Continued)

FOREIGN PATENT DOCUMENTS

| | | | | |
|---|---|---|---|---|
| CN | 104183256 | A * | 12/2014 | G11C 7/10 |
| CN | 115203097 | A * | 10/2022 | G06F 13/4282 |

(Continued)

*Primary Examiner* — Michael T Tran
(74) *Attorney, Agent, or Firm* — Pearl Cohen LLP

(57) ABSTRACT

An apparatus includes control circuits configured to connect to a plurality of planes of a nonvolatile memory array. The control circuits are configured to convert a plurality of parallel signals to a plurality of serial signals, send subsets of the plurality of serial signals to respective control circuits for each plane of the plurality of planes and convert each subset of the plurality of serial signals to corresponding parallel signals for each plane.

19 Claims, 15 Drawing Sheets

(56) References Cited

U.S. PATENT DOCUMENTS

| | | | | |
|---|---|---|---|---|
| 2003/0021177 | A1* | 1/2003 | La | G11C 7/1042 365/233.1 |
| 2007/0121389 | A1* | 5/2007 | Wu | G11C 5/066 711/100 |
| 2007/0208905 | A1* | 9/2007 | Litsyn | G11C 16/0483 711/103 |
| 2008/0101238 | A1* | 5/2008 | Dietrich | G11C 7/1078 370/235 |
| 2008/0162857 | A1* | 7/2008 | Oh | G11C 7/1069 711/170 |
| 2009/0043946 | A1* | 2/2009 | Webb | G06F 13/4256 711/E12.002 |
| 2009/0113118 | A1* | 4/2009 | Lee | G06F 12/1027 711/E12.008 |
| 2011/0016288 | A1* | 1/2011 | Chang | G06F 9/30149 711/E12.078 |
| 2012/0089793 | A1* | 4/2012 | Nazar | G11C 7/1006 711/155 |
| 2014/0355363 | A1* | 12/2014 | Byeon | G11C 7/222 365/189.17 |
| 2015/0031285 | A1* | 1/2015 | Insler | H04B 10/90 455/18 |
| 2021/0091060 | A1* | 3/2021 | Nakamura | H10B 43/27 |
| 2022/0236874 | A1* | 7/2022 | Cheng | G06F 3/0671 |
| 2024/0029785 | A1 | 1/2024 | Zhao et al. | |

FOREIGN PATENT DOCUMENTS

| | | | | | |
|---|---|---|---|---|---|
| JP | 3152672 | B2 | * | 4/2001 | |
| JP | 2014160929 | A | * | 9/2014 | H01P 3/08 |

* cited by examiner

MULTI-PLANE NONVOLATILE MEMORY WITH SERIAL ENCODER AND DECODER CIRCUITS

BACKGROUND

The present technology relates to nonvolatile memory and interfaces used for communication with nonvolatile memory.

Semiconductor memory is widely used in various electronic devices such as cellular telephones, digital cameras, personal digital assistants, medical electronics, mobile computing devices, non-mobile computing devices and data servers. Semiconductor memory may comprise nonvolatile memory or volatile memory. A nonvolatile memory allows information to be stored and retained even when the nonvolatile memory is not connected to a source of power (e.g., a battery). Examples of nonvolatile memory include flash memory (e.g., NAND-type and NOR-type flash memory), Electrically Erasable Programmable Read-Only Memory (EEPROM), and others. In NAND memory, memory cells are connected in series to form NAND strings.

When a data storage system that includes nonvolatile memory is deployed in or connected to an electronic device (the host), the memory system can be used to store data and read data. For example, data may be stored in response to a program (write) command. Data may be read in response to a read command. Data may also be erased in response to an erase command. Accessing memory cells (e.g., for read, write or erase operations) may include applying appropriate voltages to components of a memory structure. Appropriate circuits (e.g., driver circuits) may be provided to apply the required voltages. Logic circuits may control driver circuits through an interface in order to perform particular operations (e.g., to apply appropriate voltages to components to cause data to be stored or read from a specified location in nonvolatile memory or to erase a specified portion of nonvolatile memory).

BRIEF DESCRIPTION OF THE DRAWINGS

Like-numbered elements refer to common components in the different Figures.

DETAILED DESCRIPTION

Techniques are disclosed herein to facilitate communication between logic circuits and plane-specific control circuits (e.g., word line and bit line driver circuits) in multi-plane memory systems. Routing of communication channels between logic circuits and a number of plane-specific control circuits may be facilitated by using serial encoder and decoder circuits so that signals from logic circuits are converted from parallel to serial and then sent as serial communication signals, which may require fewer conductive connections (e.g., leads or traces), which may save space and simplify routing. Serial communication may use a higher clock frequency than parallel communication. Serial communication signals may be converted back to parallel communication signals for use by plane-specific control circuits. Logic circuits may be connected to a serial encoder and serial decoders may be provided for each plane. Serial communication may use Double Data Rate (DDR) encoding.

Aspects of the present technology are directed to technical problems associated with routing signals between logic circuits and plane-specific control circuits in a die. Examples of the present technology provide technical solutions that include converting parallel signals to serial format and sending serial communication over a reduced number of conductive connections.

Figure 1:
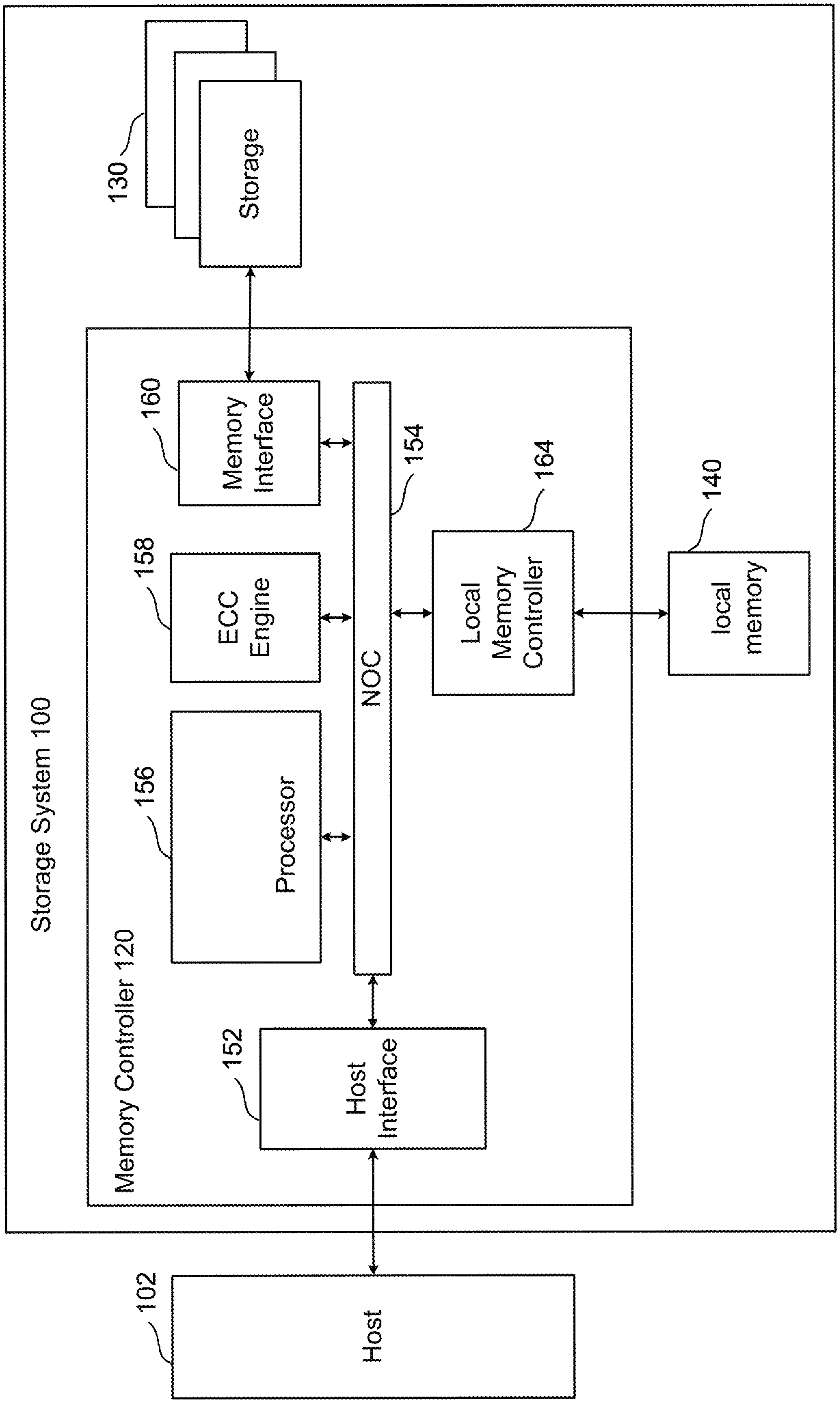
FIG. 1 is a block diagram depicting one embodiment of a storage system.

FIG. 1 is a block diagram of one embodiment of a storage system 100 that may be configured to implement aspects of the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to nonvolatile storage 130 and local high speed memory 140 (e.g., DRAM, SRAM, MRAM). Local memory 140 is non-transitory memory, which may include volatile memory or nonvolatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus.

Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the nonvolatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word “tables” they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a nonvolatile storage 130 and a subset of the L2P tables are cached (L2P cache) in the local high speed memory 140.

Memory interface 160 communicates with nonvolatile storage 130. In one embodiment, memory interface 160 provides a Toggle Mode interface. Other interfaces can also be used. In some example implementations, memory interface 160 (or another portion of memory controller 120) implements a scheduler and buffer for transmitting data to and receiving data from one or more memory die.

Figure 2A:
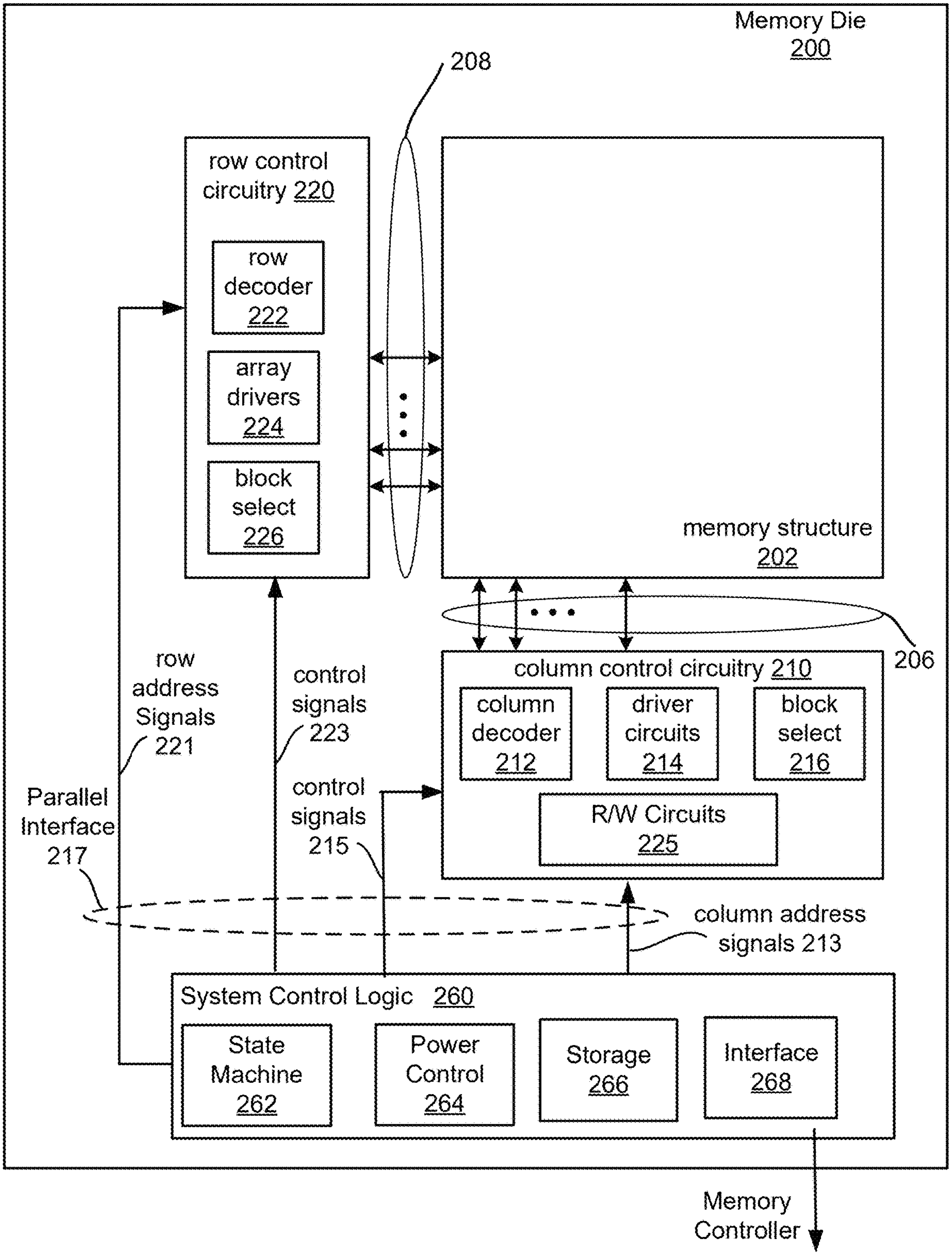
FIG. 2A is a block diagram of one embodiment of a memory die.

In one embodiment, nonvolatile storage 130 comprises one or more memory dies. FIG. 2A is a functional block diagram of one embodiment of a memory die 200 that comprises nonvolatile storage 130. Each of the one or more memory dies of nonvolatile storage 130 can be implemented as memory die 200 of FIG. 2A. The components depicted in FIG. 2A are electrical circuits. Memory die 200 includes a memory structure 202 (e.g., memory array) that can comprise nonvolatile memory cells (also referred to as nonvolatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of row address signals 221 and control signals 223 from System Control Logic 260, and typically may include such circuits as row decoders 222, array drivers 224, and block select circuit 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for memory structure 202, a memory die can include multiple arrays that can be individually accessed. Column control circuitry 210 receives column address signals 213 and control signals 215 from System Control Logic 260, and typically may include such circuits as column decoders 212, array terminal receivers or driver circuits 214, block select circuit 216, as well as read/write circuitry, and I/O multiplexers. Row address signals 221, control signals 223, column address signals 213 and control signals 215 may be sent as parallel signals from system control logic 260 to row control circuitry 220 and column control circuitry 210 (e.g., with dedicated conductive lines or traces for each control signal and/or each bit of an address information) and these parallel signals (row address signals 221, control signals 223, column address signals 213 and control signals 215) and corresponding conductors or traces may be considered a parallel interface 217 between system control logic 260 and row/column control circuitry 220/210. In addition to parallel interface 217, which is configured for communication of control signals and addresses, an additional interface (not shown) may be provided for data to be stored in memory structure 202 (e.g., write data) and data read from memory structure 202 (e.g., read data).

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a “communication interface”). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of nonvolatile memory cells in which multiple memory levels are formed above a single substrate, such as a wafer. The memory structure may comprise any type of nonvolatile memory that are monolithically formed in one or more physical levels of memory cells having an active area disposed above a silicon (or other type of) substrate. In one example, the nonvolatile memory cells comprise vertical NAND strings with charge-trapping layers.

In another embodiment, memory structure 202 comprises a two-dimensional memory array of nonvolatile memory cells. In one example, the nonvolatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular nonvolatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
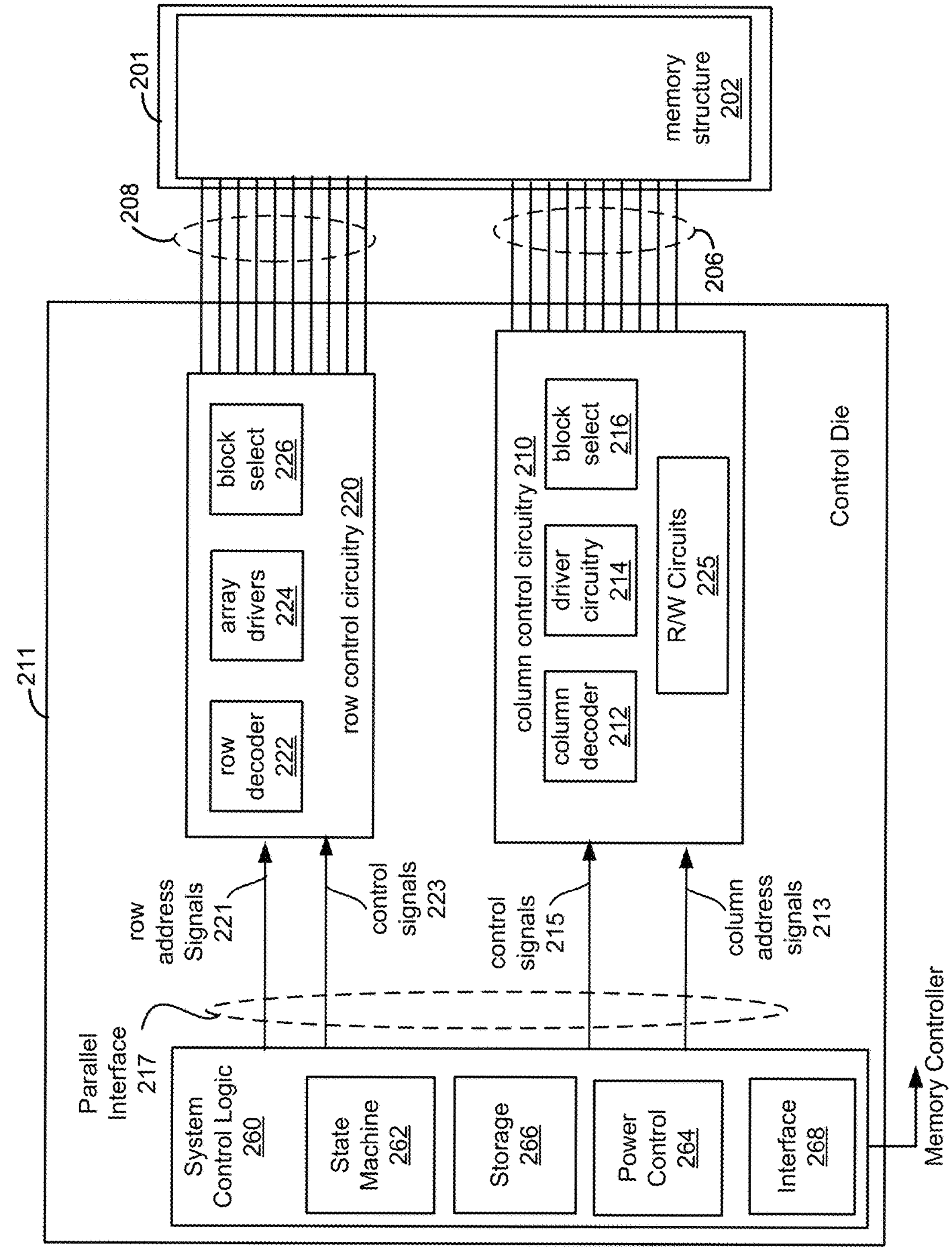
FIG. 2B is a block diagram of an example of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the nonvolatile storage 130 of storage system 100. The integrated memory assembly 207 includes two types of semiconductor dies (or more succinctly, "die"). Memory structure die 201 (memory die) includes memory structure 202. Memory structure 202 includes nonvolatile memory cells. Control die 211 includes control circuitry 260, 210, and 220 connected by parallel interface 217 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201. Locating components (e.g., peripheral circuits) such as system control logic 260, row control circuitry 220, and column control circuitry 210 in a separate die to memory structure 202 instead of locating such components with memory structure 202 on a common die (e.g., die memory die 200 of FIG. 2A) may have some advantages.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate memory controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuits 214, and block select circuit 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select circuit 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control module 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, nonvolatile storage 130, memory die 200, integrated memory assembly 207, and/or control die 211.

Figure 3:
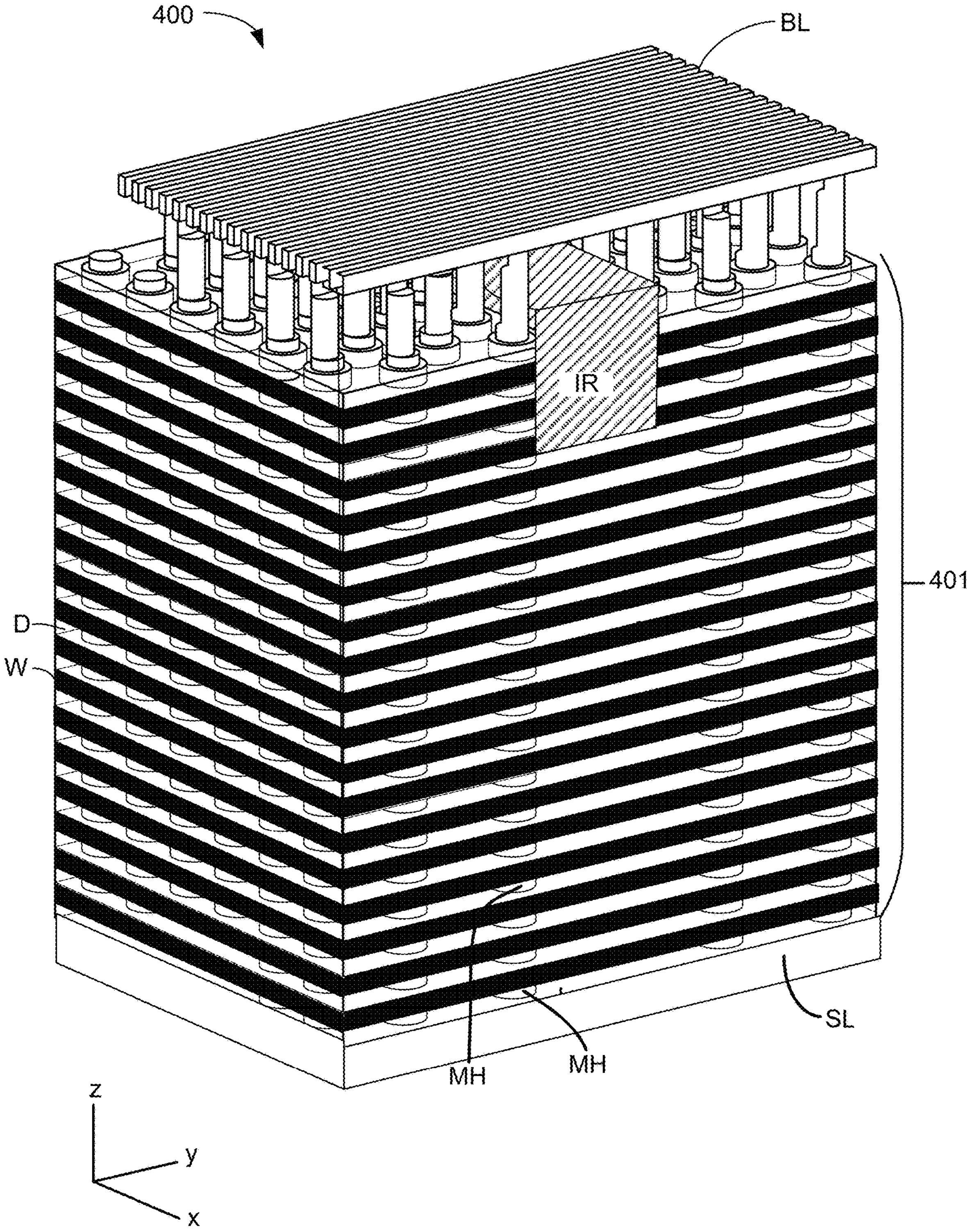
FIG. 3 shows an example of a portion of a memory structure.

FIG. 3 is a perspective view of a portion of one example embodiment of a monolithic three dimensional memory array/structure that can comprise memory structure 202, which includes a plurality nonvolatile memory cells arranged as vertical NAND strings. For example, FIG. 3 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 3 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
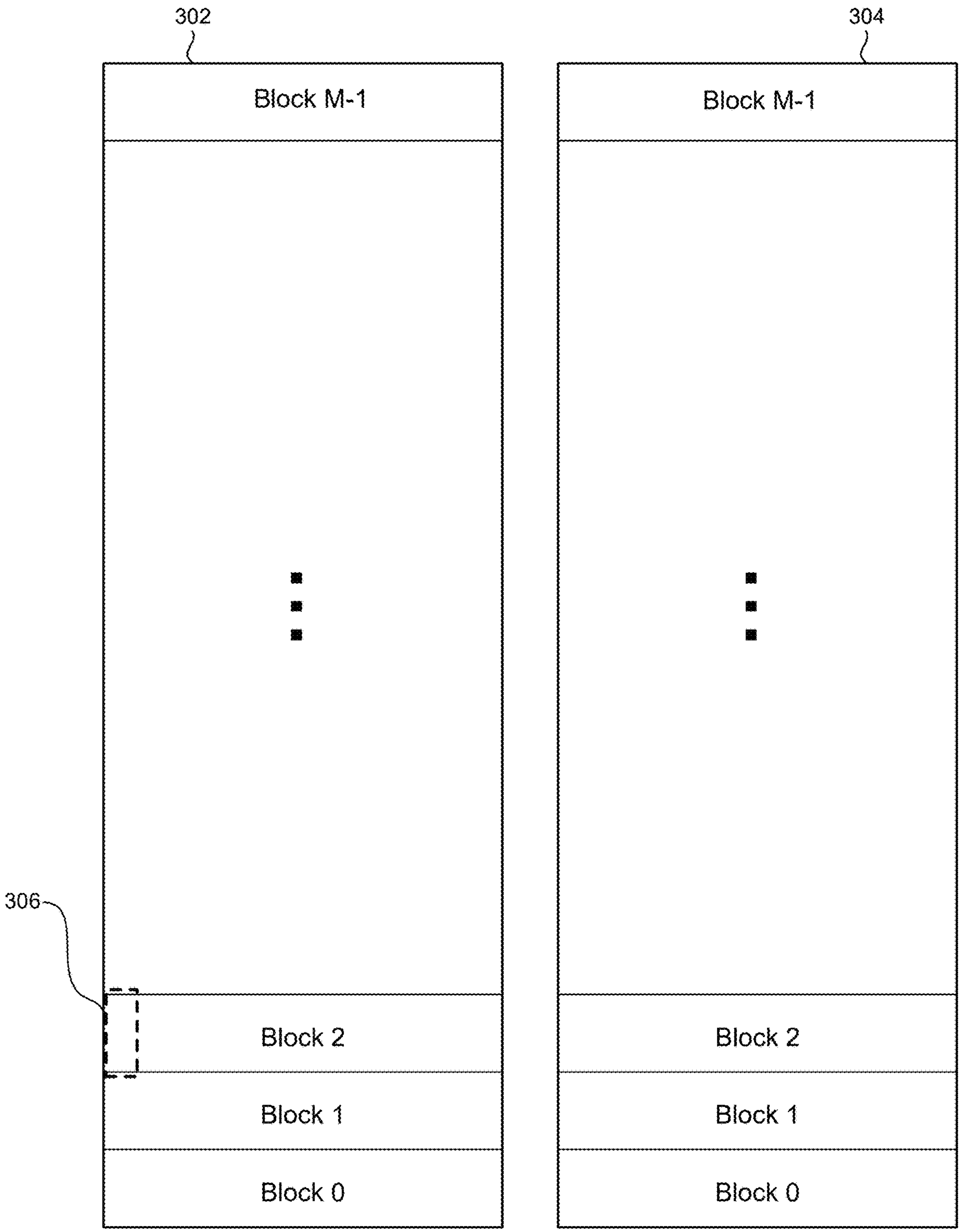
FIGS. 4A-C illustrate an example of a multi-plane memory structure.

FIG. 4A is a block diagram explaining one example organization of memory structure 202, which is divided into two planes 302 and 304 (multi-plane structure). Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 202 to enable the signaling and selection circuits. In some embodiments, a block represents a groups of connected memory cells as the memory cells of a block share a common set of word lines.

Figure 4B:
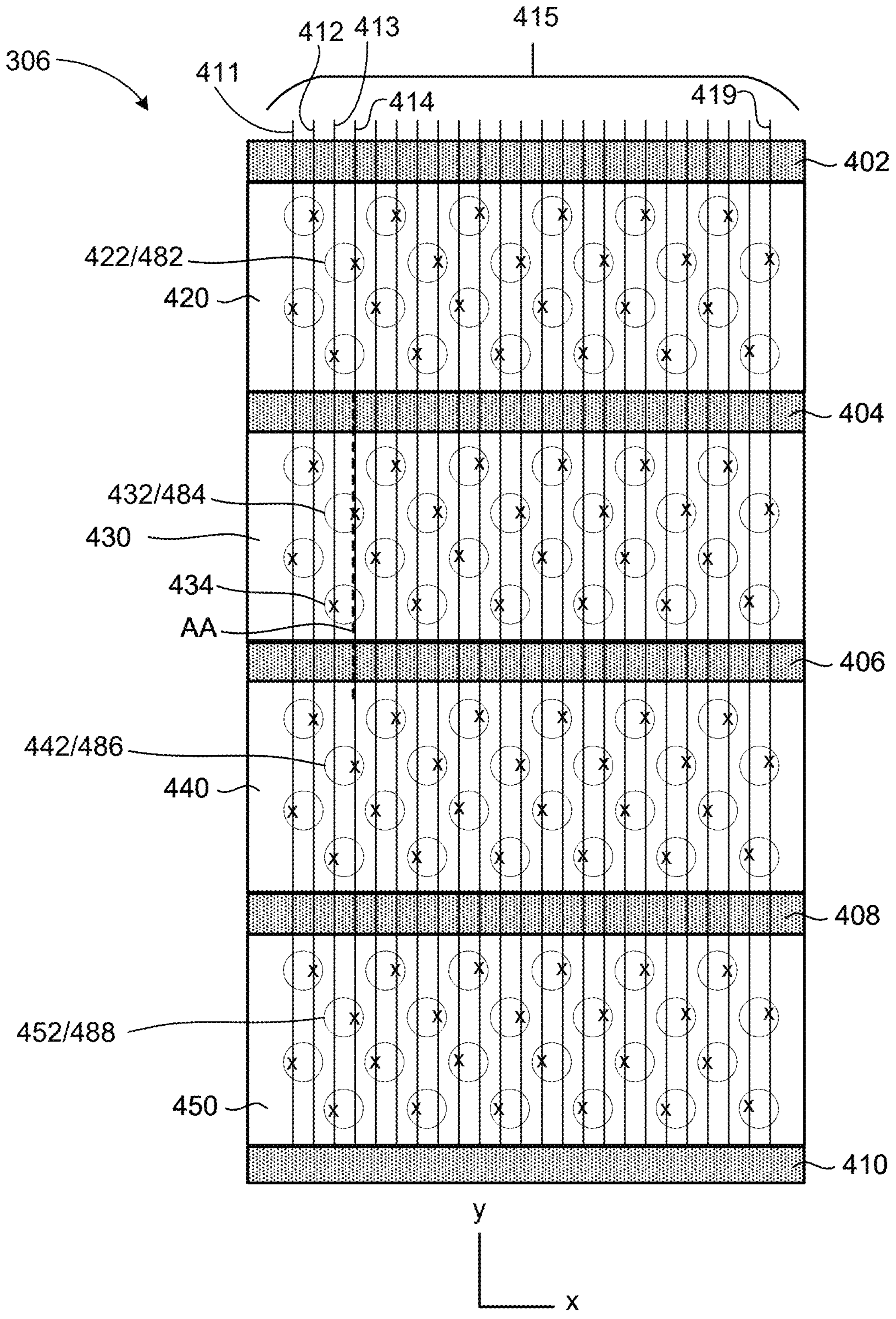
Figure 4C:
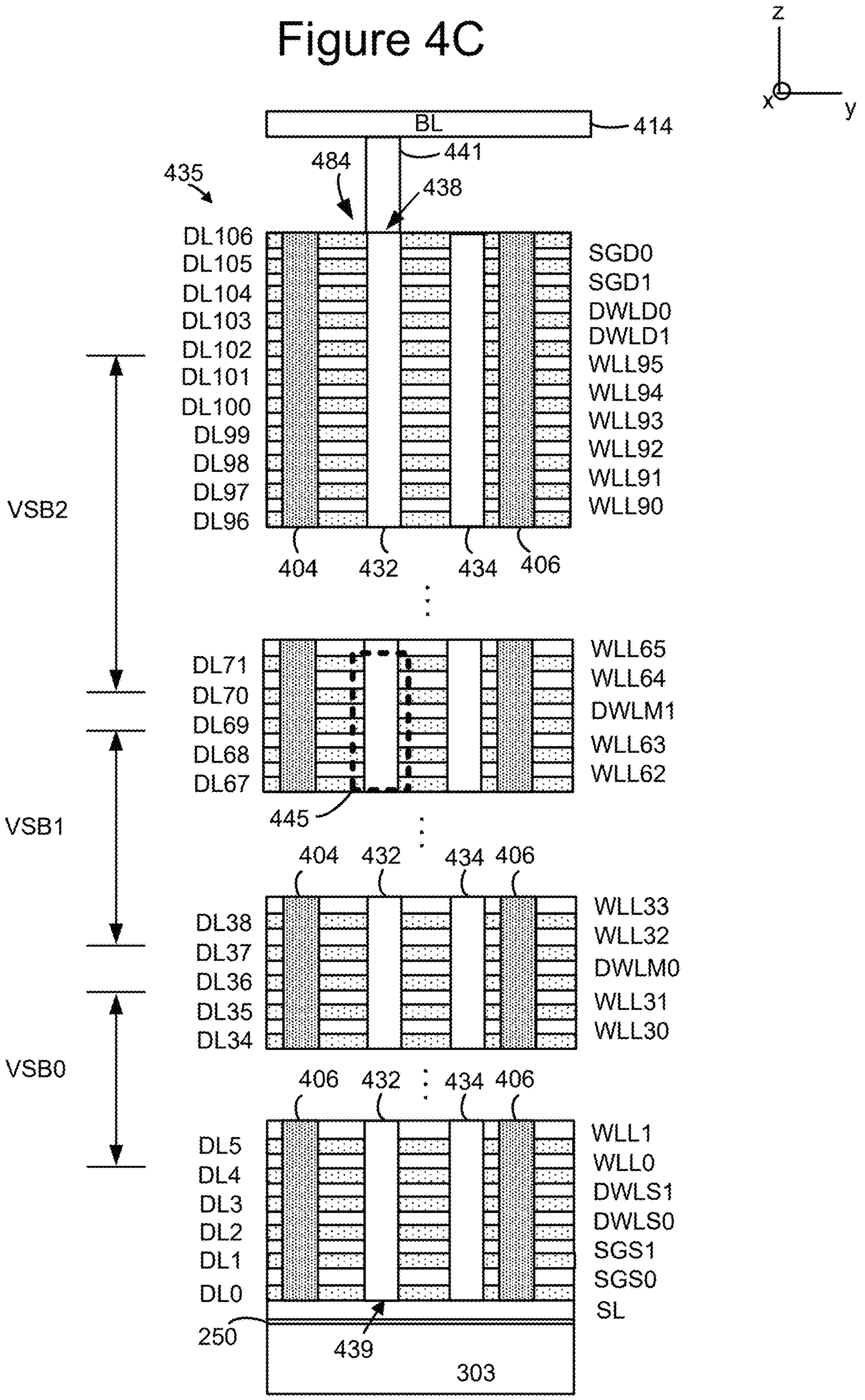

FIGS. 4B-4C depict an example three dimensional ("3D") NAND structure that corresponds to the structure of FIG. 3 and can be used to implement memory structure 202 of FIG. 2A or 2B. FIG. 4B is a block diagram depicting a top view of a portion of one block from memory structure 202. The portion of the block depicted in FIG. 4B corresponds to portion 306 in block 2 of FIG. 4A. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends beyond the portion shown, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Vertical columns 432, 434 of memory cells are depicted in the multi-layer stack. The stack includes a substrate 303, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The local interconnects 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy word line layer DMLM0 is between vertical sub-block VSB0 and vertical sub-block VSB1. Dummy word line layer DMLM1 is between vertical sub-block VSB1 and vertical sub-block VSB2. The dummy word line layers have dummy memory cell transistors that may be used to electrically isolate a first set of memory cell transistors within the memory string (e.g., corresponding with vertical sub-block VSB0 word lines WLL0-WLL31) from a second set of memory cell transistors within the memory string (e.g., corresponding with the vertical sub-block VSB1 word lines WLL32-WLL63) during a memory operation (e.g., an erase operation or a programming operation).

In some memory systems that include a multi-plane memory structure (e.g., with two or more planes as illustrated by planes 304 and 304 of FIG. 4A), each plane may have corresponding control circuits (e.g., corresponding row control circuits and column control circuits) and an appropriate parallel interface may be implemented for communication between logic circuits (e.g., system control logic 260) and such control circuits.

Figure 5A:
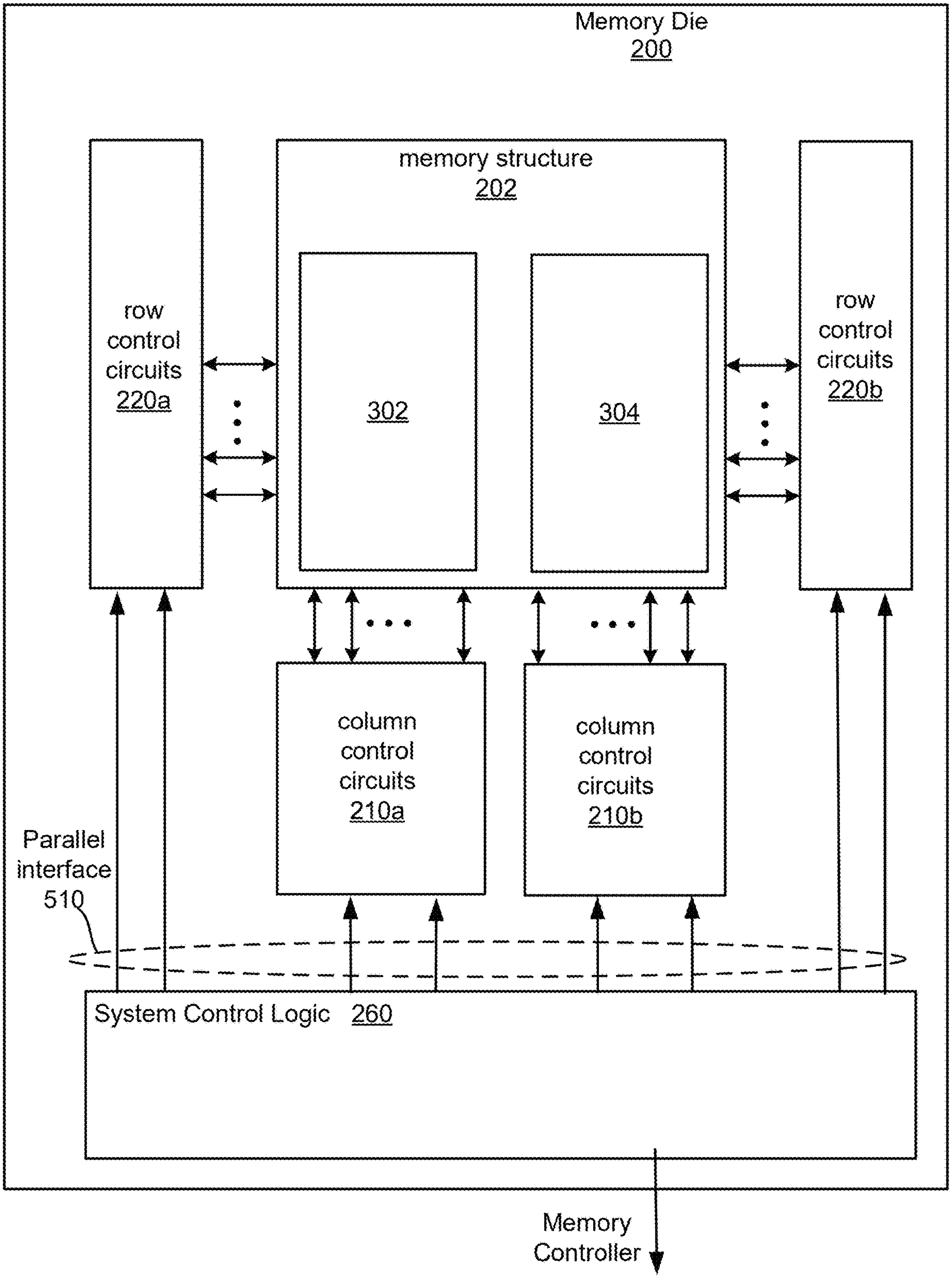
FIGS. 5A-D illustrate examples of multi-plane memory and associated control circuits.

FIG. 5A shows an example of memory die 200 in which memory structure 202 includes two planes 302 and 304, each of which has dedicated control circuits (e.g., memory die 200 of FIG. 2A implemented with a multi-plane memory structure). For example, row control circuits 202*a* and column control circuits 210*a* are dedicated to plane 302 while row control circuits 202*b* and column control circuits 210*b* are dedicated to plane 304. Parallel interface 510 may include parallel communication channels for control circuits of each plane (e.g., dedicated conductors providing dedicated signals for row control circuits 220*a*, column control circuits 210*a*, row control circuits 220*b* and column control circuits 210*b*).

Figure 5B:
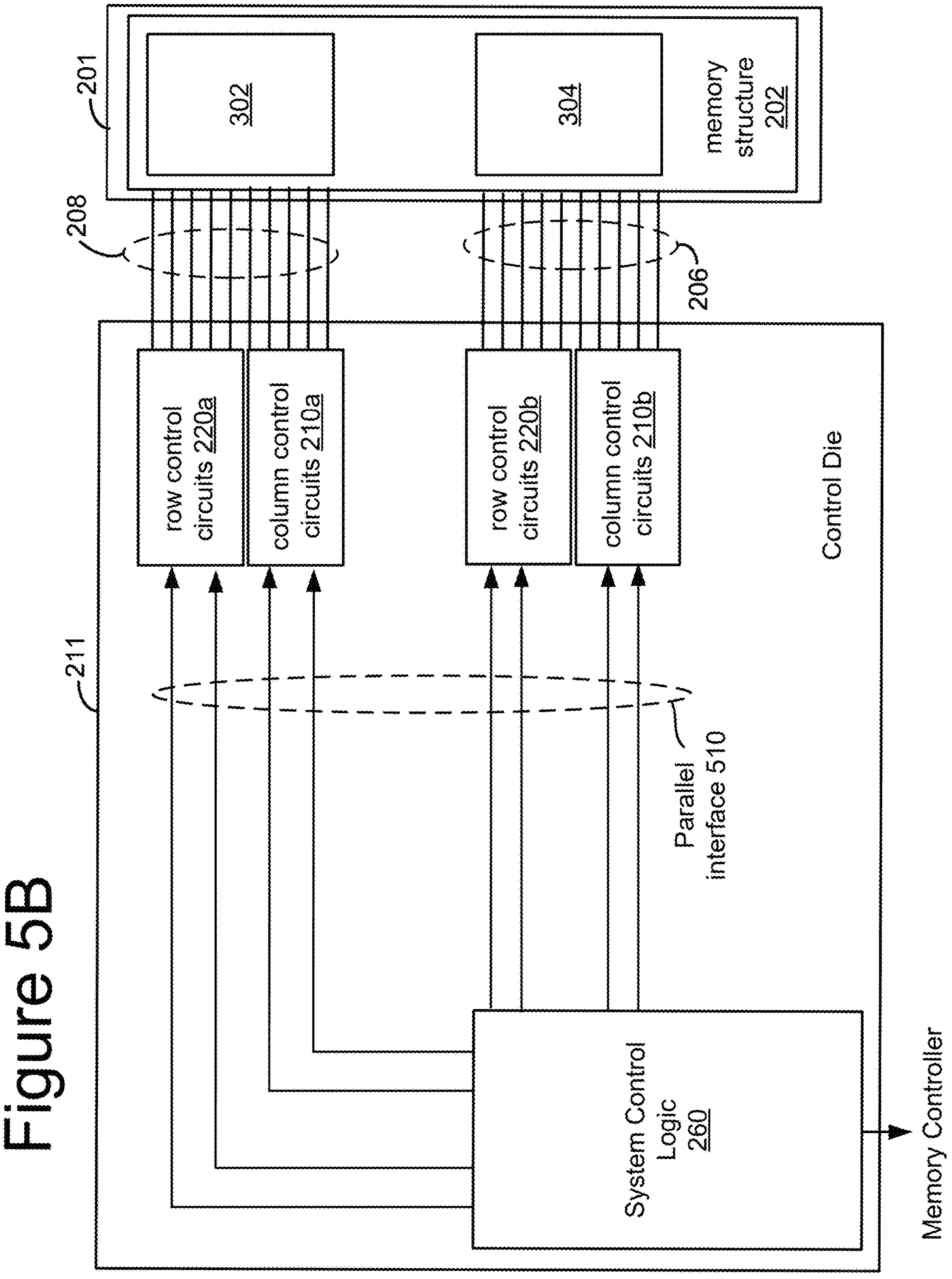

FIG. 5B shows an example of integrated memory assembly 207 in which memory structure 202 includes two planes 302 and 304, each of which has dedicated control circuits (e.g., integrated memory assembly of FIG. 2B implemented with a multi-plane memory structure). For example, row control circuits 220*a* and column control circuits 210*a* are dedicated to plane 302 while row control circuits 220*b* and column control circuits 210*b* are dedicated to plane 304. Parallel interface 510 may include parallel communication channels for control circuits of each plane (e.g., dedicated conductors providing dedicated signals for row control circuits 220*a*, column control circuits 210*a*, row control circuits 220*b* and column control circuits 210*b*). In an example implementation, control circuits may be located close to portions of a memory structure that they are designed to access so that, for example, row control circuits 220*a* and column control circuits 210*a* are close to plane 302 while row control circuits 220*b* and column control circuits 210*b* are close to plane 304. In the example of an integrated memory assembly, locating control circuits in a control die directly opposite corresponding portions of a memory structure may reduce distance and provide benefits (e.g., lower series resistance, lower capacitance, less propagation delay, simplified routing). For example, row and column control circuits 220*a*, 210*a* may be located close to (e.g., under) corresponding bond pads of control die 211 that bond to bond pads of memory structure die 201 for plane 302, while the bond pads for plane 302 may be close to plane 302 (e.g., under plane 302 and/or under an area where vertical of plane 302 is located) so that the lengths of electrical connections 208 are kept short. The distribution of control circuits and corresponding bond pads in a control die for a multi-plane memory may follow a pattern determined by the distribution of planes (and associated conductive pathways) in a corresponding memory die.

Figure 5C:
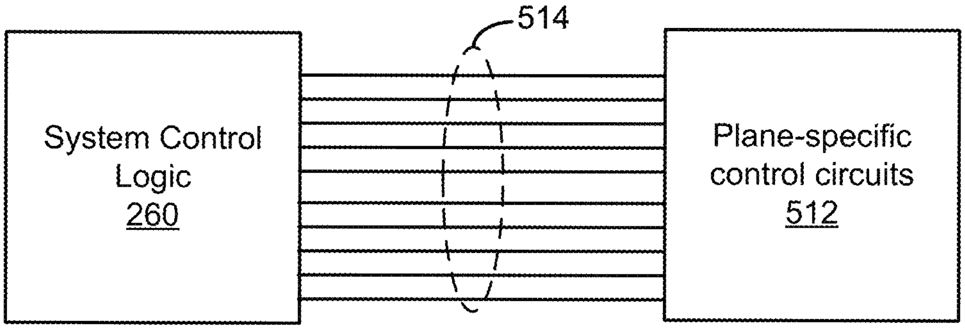

FIG. 5C illustrates parallel communication between system control logic 260 and plane-specific control circuits 512 for an individual plane (e.g., row control circuits 220*a* and column control circuits 210*a* for plane 302). A number of electrically conductive connections (e.g., wires, leads or traces) 514 extend in parallel between system control logic 260 and plane-specific control circuits 512 (e.g., a dedicated electrically conductive connection may be provided for each control signal and K electrically conductive connections may be provided for a K-bit address). Individual conductive connections may be provided for control signals such as read enable, write enable, address latch enable, command latch enable and/or other signals. Conductive connections 514 may form a portion of parallel interface 510 that is directed to an individual plane. The number of conductive connections 514 may increase as memory structures increase in size so that routing of conductive connections 514 becomes more challenging.

Figure 5D:
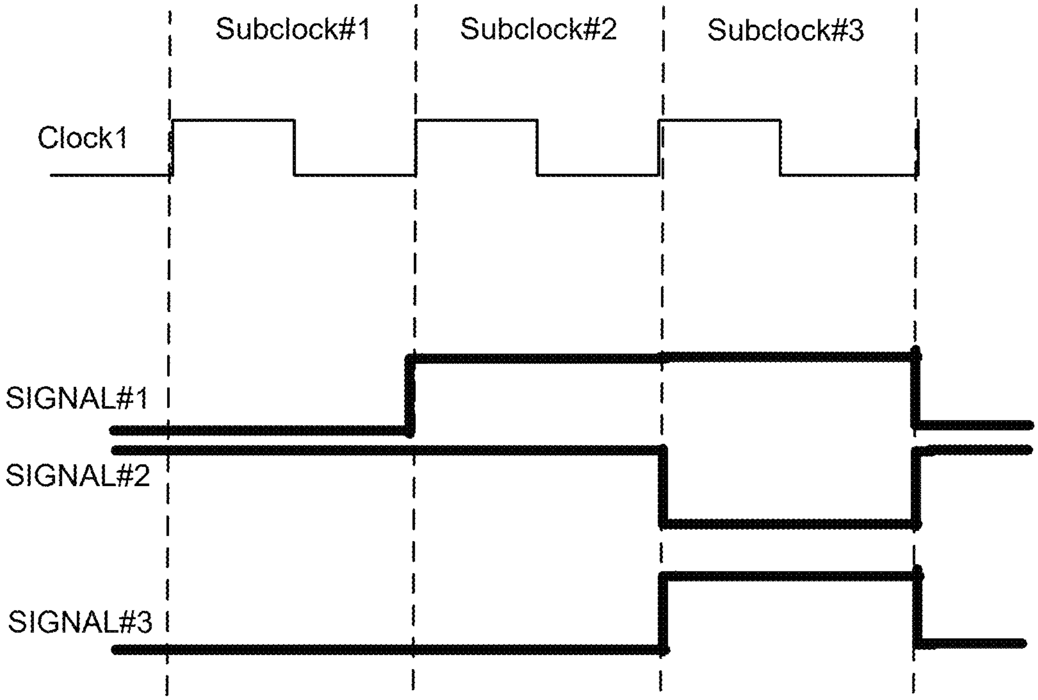

FIG. 5D illustrates parallel communication over three of conductive connections 514. FIG. 5D shows three parallel signals, Signal #1 to Signal #3, which may be any three signals (control signals or address information) corresponding to any three of conductive connections 514. Parallel interface 510 operates according to a clock (Clock1) that has a certain clock frequency (first clock frequency) and three clock cycles are illustrated in FIG. 5D, Subclock #1, Subclock #2 and Subclock #3.

While the examples of FIGS. 5A-B are two-plane examples, multi-plane memory structures may include more than two planes (e.g., four, eight, sixteen or more planes) with each plane having associated dedicated control circuits (e.g., dedicated row and column control circuits) that are connected to common logic circuits (e.g., system control logic 260). Routing of parallel interface connections in a control die may become more challenging as the number of planes, number of blocks per plane and/or memory cells and associated word lines and bit lines per block increase (e.g., as the number of layers in a 3D memory increases). When control circuits and a multi-die memory structure are located on a common die, routing may also become more challenging as the number of planes, number of blocks per plane and/or memory cells per block increase.

Figure 6:
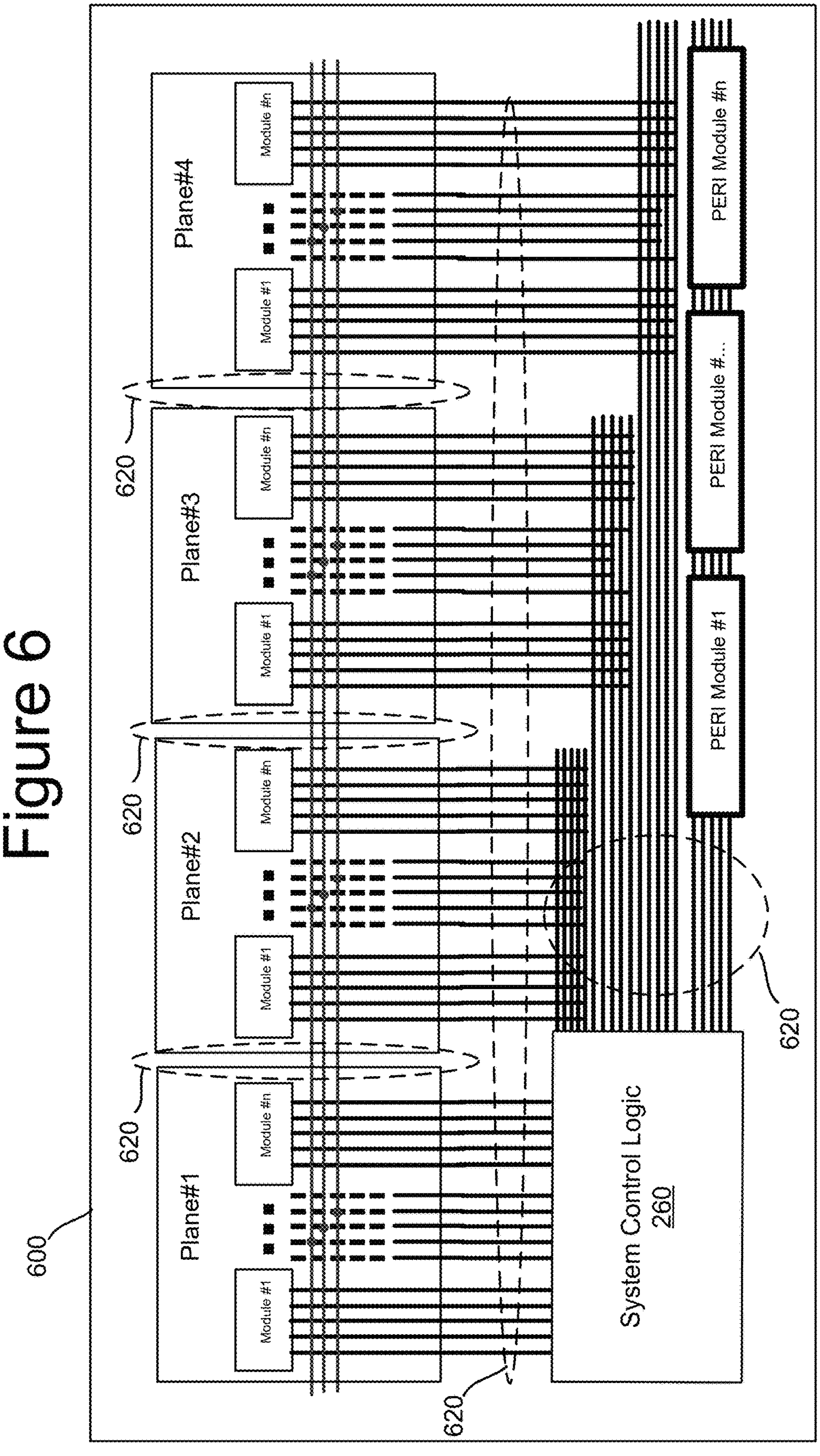
FIG. 6 illustrates an example of routing in a multi-plane memory system.

FIG. 6 shows an example of a portion of a control die 600 that is configured to connect to a multi-plane memory structure that has four planes (Plane #1-Plane #4). Control die includes control circuits for each plane marked according to the corresponding plane ("Plane #1"-"Plane #4). Control circuits for each plane include a number of modules (Module #1-Module #n), where each module may be row control or column control circuits for the corresponding plane or component circuits thereof (e.g., row decoder, row (word line) drivers, block select, column decoder, column drivers, R/W circuits). Routing conductive connections between system control logic 260 and control circuits (e.g., Module #1-Module #n) for multiple planes may be challenging. For example, one or more areas may be congested (e.g., may be particularly challenging for routing design that meets requirements because of the number of conductive connections that must pass through such a limited area). System control logic 260 is also connected to various peripheral modules that may be common to some or all planes as shown by PERI Modules #1-#n, which require additional routing and may add further constraints. Example areas of congestion 620 are shown in FIG. 6 (e.g., between plane control circuits and close to system control logic 260). In other examples, congestion may occur at other locations and the present technology is not directed to any particular pattern of routing congestion.

Aspects of the present technology are directed to facilitating efficient routing between circuits in memory systems (e.g., between logic circuits and plane-specific control circuits in memory systems with multi-plane memory structures). Aspects of the present technology are directed to technical problems associated with routing electrically conductive connections between such circuits and technical solutions include providing serial encoder and decoder circuits to enable a serial interface between circuits in a memory system (e.g., between logic circuits and plane-specific control circuits) that may be formed with fewer electrically conductive connections that may reduce routing congestion and may efficiently use available routing resources.

Figure 7A:
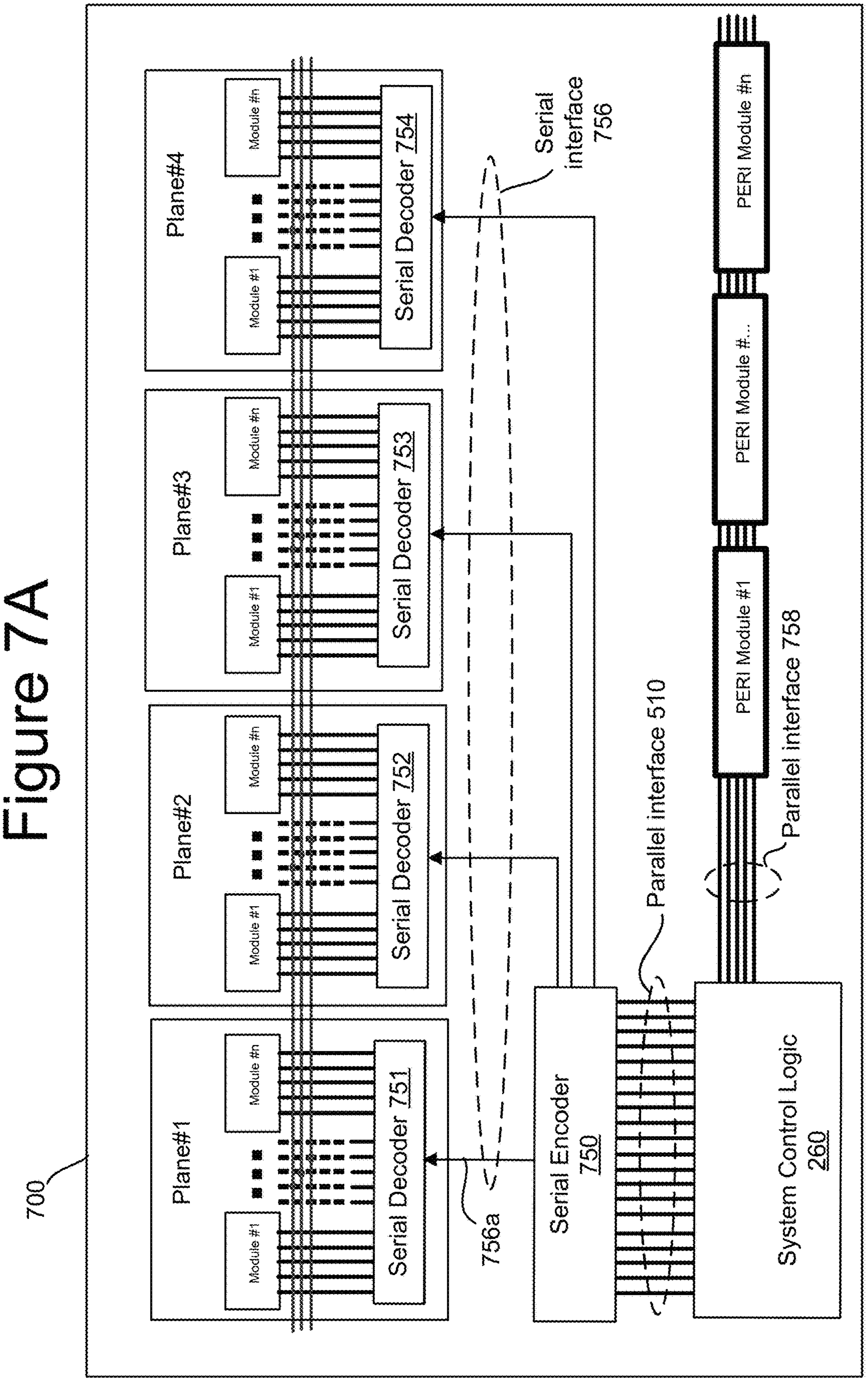
FIGS. 7A-C illustrate examples of a serial interface and corresponding routing.

FIG. 7A shows an example of a control die 700 that is configured to implement aspects of the present technology. While control die 700, like control die 600, includes system control logic 260 and plane-specific control circuits (Module #1 to Module #n), unlike control die 600, parallel interface 510 does not extend to the plane-specific control circuits. Parallel interface 510 of system control logic 260 is connected to serial encoder 750, which is configured to receive parallel signals through parallel interface 510 and convert the parallel signals to serial signals (while shown as separate from system control logic 260 in this example, serial encoder 750 may be considered part of system control logic in an example). The serial signals are sent from serial encoder 750 to serial decoders 751-754 for each plane (serial decoder 751 for Plane #1, serial decoder 752 for Plane #2, serial decoder 753 for Plane #3 and serial decoder 754 for Plane #4) over serial interface 756 (serial bus). Respective serial decoders for each plane receive corresponding subsets of the serial output signals (e.g., serial decoder 751 receives subset of conductive connections 756*a*). Serial decoders 751-754 are configured to convert corresponding subsets of the serial signals to corresponding parallel signals for each plane (e.g., corresponding subset of parallel signals of parallel interface 510). Parallel signals may be provided to control circuits (e.g., Module #1-Module #n) in each plane, which may access memory cells in corresponding planes according to the parallel signals (e.g., writing data in one or more planes or reading data from one or more planes). The combination of serial encoder 750, serial interface 756 and serial decoders 751 to 754 may be considered an example of means for converting a plurality of parallel signals to a plurality of serial signals, sending subsets of the plurality of serial signals to respective control circuits for each plane of the plurality of planes and converting each subset of the plurality of serial signals to corresponding parallel signals for each plane.

Serial interface 756 may be implemented with a smaller number of electrically conductive connections than parallel interface 510 so that routing congestion is reduced or eliminated. For example, while parallel interface 510 may require a larger number of conductive connections, serial interface 756 may require a smaller number of conductive connections (e.g., some fraction of the number of parallel conductive connections). For example, where parallel interface 510 includes a first number of connections (e.g., X connections), serial interface 756 may include a second number of connections (e.g., Y connections) that is a small fraction of the first number (e.g., Y/X<1).

FIG. 7A also shows peripheral circuits PERI Module #1 to PERI Module #n, which are connected to system control logic 260 by a parallel interface 758. While system control logic 260 may be connected to some components by a serial interface (e.g., serial interface 756), system control logic 260 may be connected to other components by a parallel interface (e.g., parallel interface 758 to PERI Module #1 to PERI Module #n).

Figure 7B:
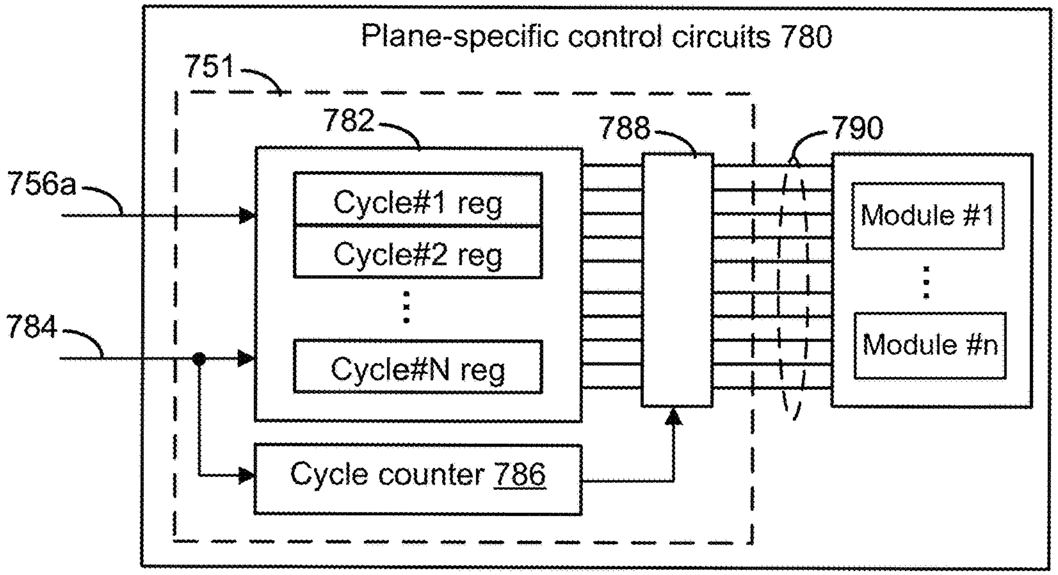

FIG. 7B illustrates an example of plane-specific circuits 780 for Plane #1 that includes Module #1 to Module #n and serial decoder 751. Example features of serial decoder 751 include a set of registers 782 that includes N registers each of which may hold multiple bits. The set of registers 782 is connected to a subset of conductive connections 756*a*, which form a serial communication channel for Plane #1 with the number of bits in each register being equal to the number of conductive connections of the serial communication channel. A clock signal 784 (second clock or Clock2) is also received and is used to control registers 782. On each cycle of clock signal 784 data from conductive connections 756*a* may be sampled and stored in a corresponding register (e.g. data stored in Cycle #1 register during a first cycle, in Cycle #2 register during a second cycle and so on). A cycle counter 786 may count clock cycles up to N (when all registers are full) and trigger parallel transfer from all registers to output register 788. Data from output register 788 provides a parallel output 790 with signals that replicates a portion of signals of parallel interface 510 for Plane #1. The number of conductive connections of parallel output 790 (first number, e.g., X) may be a multiple of the number of conductive connections 756*a* (second number, e.g., Y). For example, the first number may be N times the second number (X=N*Y, or Y=X/N). The number of conductive connections in a serial interface (second number, Y) may be an appropriate fraction of the corresponding number (first number, X) of conductive connections in a parallel interface (e.g., N may be chosen so that Y is a sufficiently small number to facilitate routing). For example, if N=8 then Y=X/8 so that the number of conductive connections is reduced by a factor of eight.

Figure 7C:
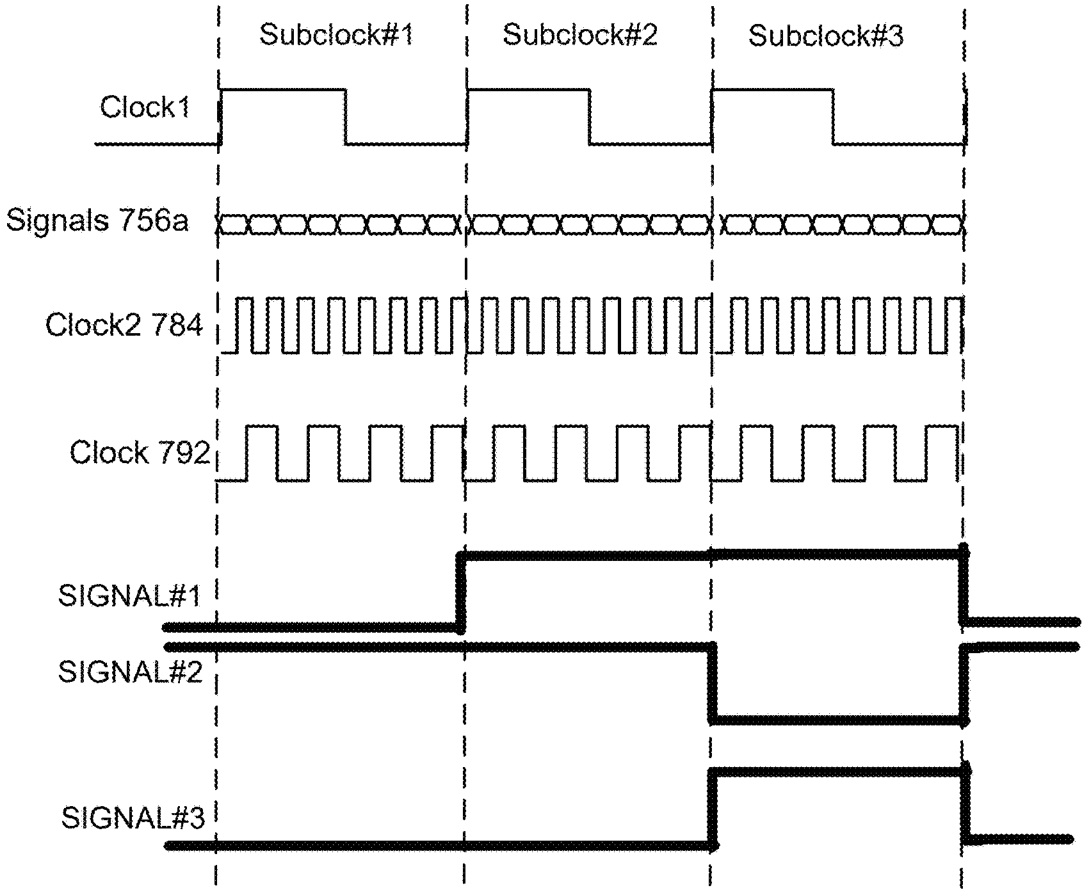

FIG. 7C illustrates signals #1-#3 of parallel interface 790, which operates according to a first clock (Clock1) with a first clock frequency (three clock cycles shown: subclock #1 to subclock #3) as previously illustrated in FIG. 5D and additionally illustrates second clock signal (clock2 784) with a second clock frequency that is a multiple of the first clock frequency. In the example shown, the ratio is eight so that the frequency of clock2 784 is eight times the frequency of the first clock, e.g., clock2 frequency=8*(clock1 frequency). The ratio of clock signals may be equal to the number of registers provided (e.g., N may be eight in this example) with one register loaded per cycle of clock2 and all registers shifted together to output register 788 after N cycles of clock2 (one cycle of clock1).

In another example, Double Data Rate (DDR) communication is used so that data is sampled twice per clock cycle (e.g., on rising edge and falling edge of a clock signal). In this case, the number of registers in registers 782 may be 2N (e.g., sixteen) and the number of conductive connections 756*a* (e.g., Y) may be ½N times the number of conductive connections in parallel interface 790 (e.g., X/2N). Thus, using DDR communication may reduce the number of conductive connections 756*a* in half compared with sampling once per clock cycle (e.g., Y=X/2N). Alternatively, a lower frequency clock signal 792 may be used and the number of conductive connections 756*a* may remain as before (e.g., Y=X/N).

In some cases, serial communication can be efficiently implemented using a small number of conductive connections (e.g., Y may be less than N/2 for DDR examples or less than N for non-DDR). For example, in some cases some control signals may transition together and these signals may be combined and may use common conductive connections.

Figure 8:
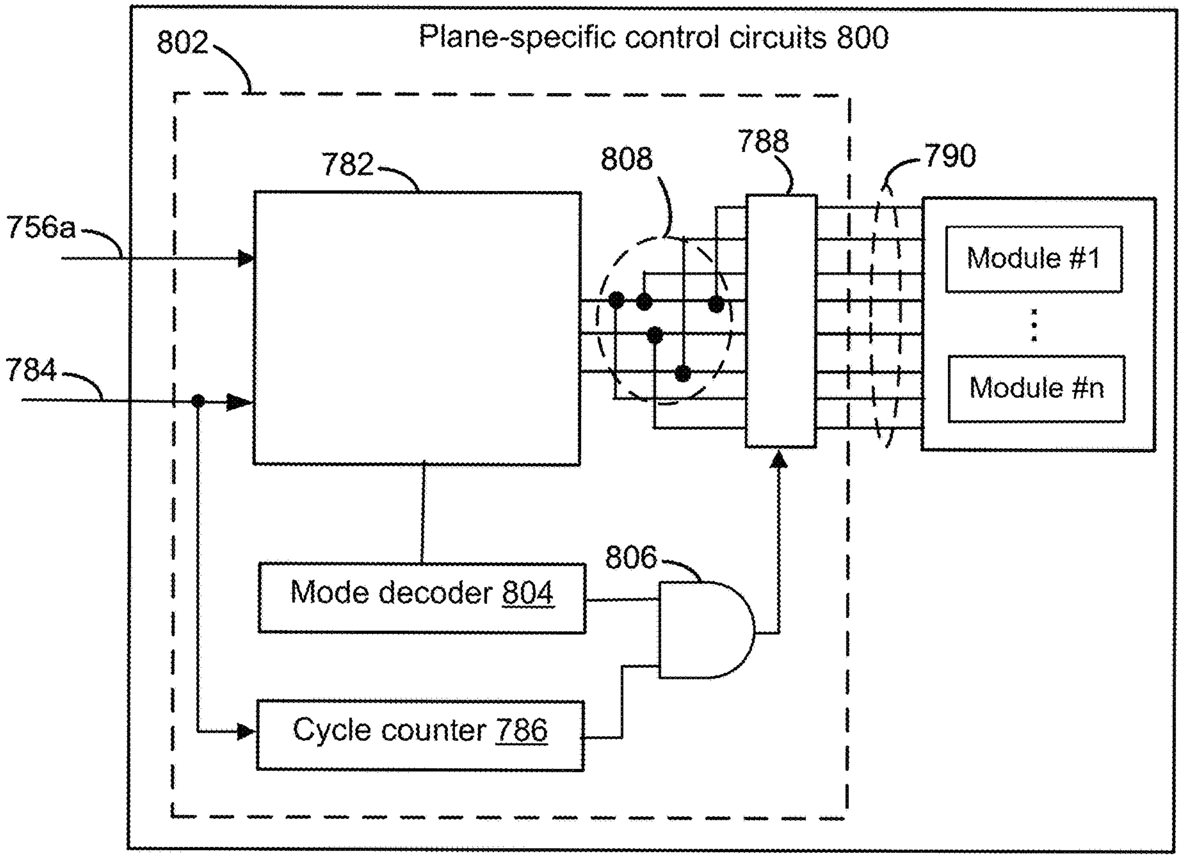
FIG. 8 illustrates an example of a serial decoder supporting efficient routing.

FIG. 8 shows an example of plane-specific control circuits 800 with a serial decoder 802 that includes a mode decoder 804 connected to registers 782. Mode information may be sent via conductive connections 756*a* and may be decoded by mode decoder 804 (e.g., using combinational logic circuits), which provides an output to AND gate 806. For example, where the number of conductors in parallel interface 790 (and number of bits transferred from output register 788 at each cycle of clock1) is X, mode decoder may generate an output that is X-bits wide. Registers 782 provide an output that is less than X-bits wide and connections 808 are provided to generate X inputs to output registers 788 (e.g., one output from registers 782 may be connected to more than one input of output registers 788. This reduced number of outputs from registers 782 may allow registers 782 to be smaller and allow the use of a smaller number of conductive connections 756*a* (e.g., fewer than X/2N for DDR or less than X/2 for non-DDR). Connections 808 may be arranged according to the command sequences used in specific memory systems.

When cycle counter 786 reaches N cycles and provides an output signal to AND gate 806 it causes the X-bit output of mode decoder 804 to be sent to output register 788 where it causes only selected bits to be activated. For example, some bits may remain unchanged in output register 788 (e.g., where connections 808 provide two or more inputs to output registers 788 from a single output of registers 782, only one of the corresponding bits in output registers 788 may be changed, as determined by mode selection, while the other bits keep their previous state). Mode information may be sent over conductive connections 756*a* (e.g., in one or more cycle of clock2) and loaded into mode decoder 804 instead of registers 782. For example, where a serial bus formed by conductive connections 756*a* is Y-bits wide, mode information may be a Y-bit code that takes one cycle of clock2.

While the examples above refer to a fixed subclock duration at parallel interface 790, in some cases, subclock duration may be variable (e.g., with a minimum period set by clock1 frequency). For example, for some memory operations not all control signals change every clock cycle and some control signals may remain unchanged for extended periods. Subclock duration may be extended and timing restrictions may be relaxed accordingly.

Figure 9:
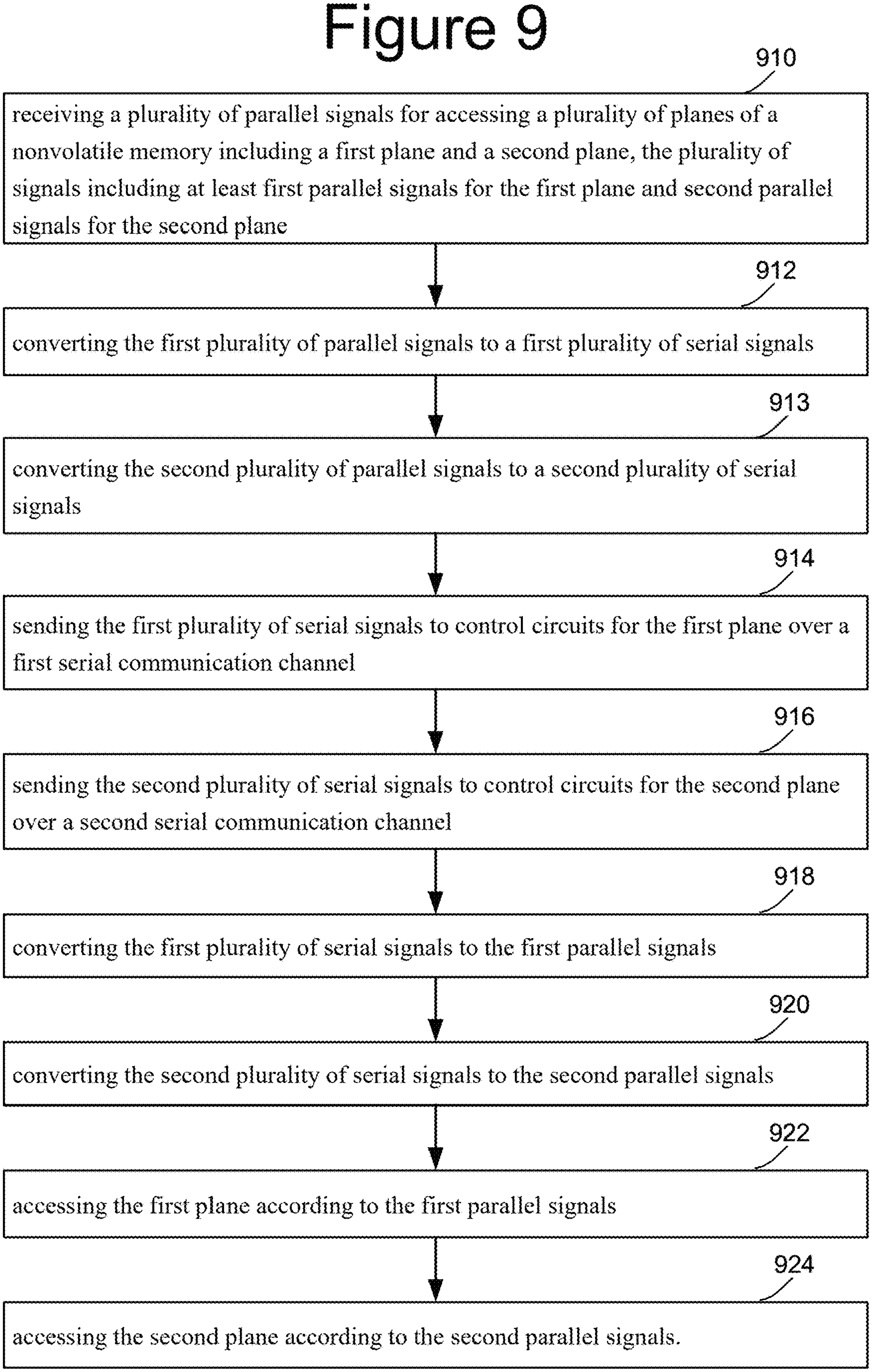
FIG. 9 illustrates an example of a method that includes sending signals over a serial interface.

FIG. 9 shows an example of a method that includes receiving a plurality of parallel signals for accessing a plurality of planes of a nonvolatile memory including a first plane and a second plane, the plurality of signals including at least first parallel signals for the first plane and second parallel signals for the second plane 910, converting the first plurality of parallel signals to a first plurality of serial signals 912, converting the second plurality of parallel signals to a second plurality of serial signals 913 (e.g., in serial encoder 750), sending the first plurality of serial signals to control circuits for the first plane over a first serial communication channel 914 (e.g., sending signals for Plane #1 over a serial communication channel formed by conductive connections 756*a*) and sending the second plurality of serial signals to control circuits for the second plane over a second serial communication channel 916. The method further includes converting the first plurality of serial signals to the first parallel signals 918 (e.g., by serial decoder 751), converting the second plurality of serial signals to the second parallel signals 920 (e.g., by serial decoder 752), accessing the first plane according to the first parallel signals 922, and accessing the second plane according to the second parallel signals 924 (e.g., performing read or write operations according to address and/or command signals).

An example of an apparatus includes one or more control circuits configured to connect to a plurality of planes of a nonvolatile memory array. The one or more control circuits are configured to convert a plurality of parallel signals to a plurality of serial signals, send subsets of the plurality of serial signals to respective control circuits for each plane of the plurality of planes and convert each subset of the plurality of serial signals to corresponding parallel signals for each plane.

In one or more embodiments, the plurality of parallel signals includes write address information specifying a physical location for writing data in one or more of the plurality of planes.

In one or more embodiments, the plurality of parallel signals includes read address information specifying a physical location for reading data from one or more of the plurality of planes.

In one or more embodiments, the plurality of parallel signals includes control signals including one or more of read enable, write enable, address latch enable and command latch enable.

In one or more embodiments, the one or more control circuits further include respective driver circuits for each of the plurality of planes that are configured to apply voltages to word lines and bit lines according to the parallel signals for respective planes.

In one or more embodiments, the control circuits include a serial encoder to convert the plurality of parallel signals to the plurality of serial signals, a plurality of serial decoders for respective planes of the plurality of planes to convert respective subsets of the plurality of serial signals to corresponding parallel signals, each serial decoder connected to the serial encoder by a respective serial communication channel.

In one or more embodiments, the plurality of parallel signals has a first clock frequency, the serial encoder is configured to send the plurality of serial signals with a second clock frequency where the second clock frequency is N times the first clock frequency.

In one or more embodiments, the plurality of parallel signals consists of a first number of parallel signals per plane, each subset of the plurality of serial signals consists of a second number of serial signals and the second number is less than or equal to the first number divided by N.

In one or more embodiments, the serial encoder and the plurality of serial decoders are configured for Double Data Rate (DDR) communication and the second number is less than or equal to the first number divided by 2N.

In one or more embodiments, each serial decoder includes a set of registers to store serial data, a mode decoder that is configured to receive mode information and an output register that is connected to the set of registers and is controlled by the mode decoder.

In one or more embodiments, the one or more control circuits are located in a control die that is configured to be bonded to a memory die that includes the plurality of planes of the nonvolatile memory array to form an integrated memory assembly.

In one or more embodiments, the one or more control circuits and the plurality of planes of the nonvolatile memory array are located on a common die.

An example of a method includes receiving parallel signals for accessing a plurality of planes of a nonvolatile memory including a first plane and a second plane, the parallel signals including at least a first plurality of parallel signals for the first plane and a second plurality of parallel signals for the second plane; converting the first plurality of parallel signals to a first plurality of serial signals; converting the second plurality of parallel signals to a second plurality of serial signals; sending the first plurality of serial signals to control circuits for the first plane over a first serial communication channel; sending the second plurality of serial signals to control circuits for the second plane over a second serial communication channel; converting the first plurality of serial signals to the first plurality of parallel signals; converting the second plurality of serial signals to the second plurality of parallel signals; accessing the first plane according to the first plurality of parallel signals; and accessing the second plane according to the second plurality of parallel signals.

In one or more embodiments, accessing the first and second planes includes writing data in the first and second planes or reading data from the first and second planes.

In one or more embodiments, the parallel signals include address information for writing or reading in the first and second planes.

In one or more embodiments, the first plurality of parallel signals includes a first number of signals with a first clock frequency, the first plurality of serial signals includes a second number of signals with a second clock frequency, the second clock frequency is N times the first clock frequency and the second number is less than or equal to the first number divided by N.

In one or more embodiments, sending the first and second pluralities of serial signals to control circuits for the first and second planes over the first and second serial communication channels includes using Double Data Rate communication and the second number is less than or equal to the first number divided by 2N.

An example of a data storage system includes a plurality of nonvolatile memory cells arranged in a plurality of planes; and means for converting a plurality of parallel signals to a plurality of serial signals, sending subsets of the plurality of serial signals to respective control circuits for each plane of the plurality of planes and converting each subset of the plurality of serial signals to corresponding parallel signals for each plane.

In one or more embodiments, the plurality of nonvolatile memory cells are located on a memory die, the means for converting is located on a control die and the memory die is bonded to the control die to form an integrated memory assembly.

In one or more embodiments, the plurality of nonvolatile memory cells are arranged in a 3D structure that includes vertical NAND strings.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits in a die, the one or more control circuits configured to connect to a plurality of planes of a nonvolatile memory array, the one or more control circuits are configured to:

convert a plurality of parallel signals to a plurality of serial signals in an encoding circuit located in the die, send subsets of the plurality of serial signals from the encoding circuit to respective decoding circuits for each plane of the plurality of planes and convert each subset of the plurality of serial signals to corresponding parallel signals for each plane in the decoding circuits, which are located in the die.

2. The apparatus of claim 1, wherein the plurality of parallel signals includes write address information specifying a physical location for writing data in one or more of the plurality of planes.

3. The apparatus of claim 1, wherein the plurality of parallel signals includes read address information specifying a physical location for reading data from one or more of the plurality of planes.

4. The apparatus of claim 1, wherein the plurality of parallel signals includes control signals including one or more of read enable, write enable, address latch enable and command latch enable.

5. The apparatus of claim 1, wherein the one or more control circuits further include respective driver circuits for each of the plurality of planes that are configured to apply voltages to word lines and bit lines according to the parallel signals for respective planes.

6. The apparatus of claim 1, wherein the control circuits include a serial encoder to convert the plurality of parallel signals to the plurality of serial signals, a plurality of serial decoders for respective planes of the plurality of planes to convert respective subsets of the plurality of serial signals to corresponding parallel signals, each serial decoder connected to the serial encoder by a respective serial communication channel.

7. The apparatus of claim 6, wherein the plurality of parallel signals has a first clock frequency, the serial encoder is configured to send the plurality of serial signals with a second clock frequency where the second clock frequency is N times the first clock frequency.

8. The apparatus of claim 7, wherein the plurality of parallel signals consists of a first number of parallel signals per plane, each subset of the plurality of serial signals consists of a second number of serial signals and the second number is less than or equal to the first number divided by N.

9. The apparatus of claim 8, wherein the serial encoder and the plurality of serial decoders are configured for Double Data Rate (DDR) communication and the second number is less than or equal to the first number divided by 2N.

10. The apparatus of claim 6, wherein each serial decoder includes a set of registers to store serial data, a mode decoder that is configured to receive mode information and an output register that is connected to the set of registers and is controlled by the mode decoder.

11. The apparatus of claim 1, wherein the one or more control circuits are located in a control die that is configured to be bonded to a memory die that includes the plurality of planes of the nonvolatile memory array to form an integrated memory assembly.

12. The apparatus of claim 1, wherein the one or more control circuits and the plurality of planes of the nonvolatile memory array are located on a common die.

13. A method comprising:

receiving parallel signals for accessing a plurality of planes of a nonvolatile memory including a first plane and a second plane, the parallel signals including at least a first plurality of parallel signals for the first plane and a second plurality of parallel signals for the second plane, the first plurality of parallel signals includes a first number of signals with a first clock frequency;

converting the first plurality of parallel signals to a first plurality of serial signals that includes a second number of signals with a second clock frequency, the second clock frequency is N times the first clock frequency and the second number is less than or equal to the first number divided by N;

converting the second plurality of parallel signals to a second plurality of serial signals;

sending the first plurality of serial signals to control circuits for the first plane over a first serial communication channel;

sending the second plurality of serial signals to control circuits for the second plane over a second serial communication channel;

converting the first plurality of serial signals to the first plurality of parallel signals;

converting the second plurality of serial signals to the second plurality of parallel signals;

accessing the first plane according to the first plurality of parallel signals; and accessing the second plane according to the second plurality of parallel signals.

14. The method of claim 13, wherein accessing the first and second planes includes writing data in the first and second planes or reading data from the first and second planes.

15. The method of claim 14, wherein the parallel signals include address information for writing or reading in the first and second planes.

16. The method of claim 13, wherein sending the first and second pluralities of serial signals to control circuits for the first and second planes over the first and second serial communication channels includes using Double Data Rate communication and the second number is less than or equal to the first number divided by 2N.

17. A data storage system comprising:

a plurality of nonvolatile memory cells arranged in a plurality of planes; and means for converting a plurality of parallel signals to a plurality of serial signals in a die, sending subsets of the plurality of serial signals to respective control circuits in the die for each plane of the plurality of planes and in the respective control circuits, converting each subset of the plurality of serial signals to corresponding parallel signals for each plane.

18. The data storage system of claim 17, wherein the plurality of nonvolatile memory cells are located on a memory die, the means for converting is located on a control die and the memory die is bonded to the control die to form an integrated memory assembly.

19. The data storage system of claim 18, wherein the plurality of nonvolatile memory cells are arranged in a 3D structure that includes vertical NAND strings.

* * * * *